(12) United States Patent
Ise

(10) Patent No.: US 6,905,787 B2
(45) Date of Patent: Jun. 14, 2005

(54) LIGHT EMITTING ELEMENT

(75) Inventor: Toshihiro Ise, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/644,872

(22) Filed: Aug. 21, 2003

(65) Prior Publication Data
US 2004/0043250 A1 Mar. 4, 2004

(30) Foreign Application Priority Data
Aug. 22, 2002 (JP) ........................................ 2002-241662

(51) Int. Cl.$^7$ ............................................. H05B 33/12
(52) U.S. Cl. ....................... 428/690; 428/917; 313/504; 313/506
(58) Field of Search ................................ 428/690, 917; 313/504, 506

(56) References Cited

U.S. PATENT DOCUMENTS 6,573,650 B2 * 6/2003 Aoki et al. ................. 313/503

FOREIGN PATENT DOCUMENTS

JP 2001-247498 9/2001

* cited by examiner

Primary Examiner—Dawn Garrett
(74) Attorney, Agent, or Firm—Sughrue Mion, PLLC

(57) ABSTRACT

The present invention provides a light emitting element having at least one organic layer which includes a light emitting layer, and which is provided between a pair of electrodes. In this structure, at least one layer of the at least one organic layer contains at least one compound consisting essentially of carbon, fluorine and silicon.

26 Claims, No Drawings

LIGHT EMITTING ELEMENT

CROSS-REFERENCE TO RELATED APPLICATION

This application claims priority under 35USC 119 from Japanese Patent Application No. 2002-241662, the disclosure of which is incorporated by reference herein.

BACKGROUND OF THE INVENTION

1. Field of the Invention

The present invention relates to a light emitting element such as an organic electroluminescent element. Particularly, the present invention relates to a light emitting element that has high luminance and luminous efficiency, and also has superior endurance.

2. Description of the Related Art

In recent years, organic electroluminescent (EL) elements have been actively investigated and developed, since these elements can emit light with high luminance through a low-voltage driving process. In general, an organic EL element is constituted by a light emitting layer and a pair of opposing electrodes that sandwich this layer, and electrons, injected through a cathode, and holes, injected through an anode, are recombined in the light emitting layer so that excitons are generated, and utilized to emit light.

Recently, organic EL elements have become highly efficient. The external quantum efficiency of an organic EL element using an iridium complex as a light emitting material has exceeded 5%, which had been conventionally considered as a limit, and reached 8% (Applied Physics Letters, Vol. 75, page 4, published in 1999).

Japanese Patent Application Laid-Open (JP-A) No. 2001-247498 discloses an organic EL element using a material consisting of carbon and fluorine.

However, the conventional organic EL elements fail to provide sufficient endurance, and there is strong demand for development of organic EL elements having high luminance, high luminous efficiency, and superior endurance.

SUMMARY OF THE INVENTION

An aspect of the present invention is to provide an organic EL element that has high luminance, high luminous efficiency and superior endurance. The other aspect of the present invention is to provide an organic EL element that has superior color purity (in particular, purity of blue).

The present invention provides a light emitting element comprising at least one organic layer which includes a light emitting layer, and which is disposed between a pair of electrodes, wherein at least one layer of the at least one organic layer contains at least one compound consisting essentially of carbon, fluorine and silicon. The compounds contains hydrogen atoms in an amount of not greater than two hydrogen atoms per six carbon atoms.

In the present invention, the compound is preferably a compound represented by the following general formula (I):

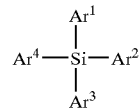

General Formula (I)

wherein in general formula (I), each of $Ar^1$, $Ar^2$, $Ar^3$ and $Ar^4$ represents an aryl group consisting of carbon and fluorine.

Moreover, in the present invention, the compound is preferably a compound represented by the following general formula (II):

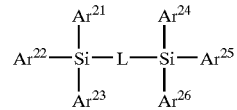

General Formula (II)

wherein in general formula (II), each of $Ar^{21}$, $Ar^{22}$, $Ar^{23}$, $Ar^{24}$, $Ar^{25}$ and $Ar^{26}$ represents an aryl group consisting of carbon and fluorine, and L represents a divalent arylene group consisting of carbon and fluorine.

DETAILED DESCRIPTION OF THE INVENTION

A light emitting element of the present invention will be described in detail below.

The light emitting element comprising at least one organic layer which includes a light emitting layer, and which is disposed between a pair of electrodes, wherein at least one layer of the at least one organic layer contains at least one compound (hereinafter, referred to as "specific compound") consisting essentially of carbon, fluorine and silicon.

With regard to the above-mentioned specific compound, the expression, "consisting essentially of carbon, fluorine and silicon" refers to the fact that most preferably, the compound contains no atoms, other than carbon, fluorine and silicon atoms, that is, no atoms including hydrogen atoms, other than these atoms. However, with respect to hydrogen atoms, the compound may contains not more than two hydrogen atoms (more preferably, not more than one) per six carbon atoms contained in the compound, and even in this case, the compound makes it possible to sufficiently provide the effects of the present invention.

In the above-mentioned specific compound, the ratio of the number of fluorine atoms to the number of carbon atoms contained in a molecule is preferably from 55% to 90%, more preferably from 57% to 88%, and still more preferably from 60% to 85%.

When durability of the light emitting element is taken into consideration, a glass transition temperature (Tg) of the specific compound is preferably from 130° C. to 400° C., more preferably, from 135° C. to 400° C., still more preferably, from 140° C. to 400° C., particularly preferably, from 150° C. to 400° C., and most preferably, from 160° C. to 400° C.

In this case, the glass transition temperature (Tg) can be confirmed by thermal measurements, such as differential scanning calorimetry (DSC) and differential thermal analysis (DTA), X-ray diffraction (XRD), observation under a polarizing microscope or the like.

As will be described below, the light emitting element of the invention may utilize either light emission from an excited singlet state or light emission from an excited triplet state. However, when the light emitting element utilizes light emission from the excited triplet state, the above-mentioned specific compound preferably has a minimum excited triplet energy level ($T_1$ level) from 65 kcal/mol (272.35 kJ/mol) to 95 kcal/mol (398.05 kJ/mol), more preferably, from 67 kcal/mol (280.73 kJ/mol) to 95 kcal/mol (398.05 kJ/mol), still more preferably, from 69 kcal/mol (289.11 kJ/mol) to 95 kcal/mol (398.05 kJ/mol), and particularly preferably, from 71 kcal/mol (297.49 kJ/mol) to 95 kcal/mol (398.05 kJ/mol).

The compound (specific compound) consisting essentially of carbon, fluorine and silicon used in the present invention will be described below.

<Compound Represented by General Formula (I)>

Preferable examples of the above-mentioned specific compound used in the present invention include a compound represented by the following general formula (I):

General Formula (I)

wherein in general formula (I), each of $Ar^1$, $Ar^2$, $Ar^3$ and $Ar^4$ represents an aryl group consisting of carbon and fluorine.

Compounds represented by general formula (I) will be described below.

In general formula (I), the aryl groups represented by $Ar^1$, $Ar^2$, $Ar^3$ and $Ar^4$, which consist of carbon and fluorine, may be the same as or different from each other, and may be a single ring or a condensed ring in which two or more rings are condensed.

In general formula (I), each of the above-mentioned $Ar^1$, $Ar^2$, $Ar^3$ and $Ar^4$ is preferably a perfluorophenyl group, a perfluorobiphenyl group, a perfluoronaphthyl group, a perfluoroanthracenyl group, a perfluorophenanthryl group, a perfluoropyrenyl group, a perfluoronaphthacenyl group, a perfluoroperylenyl group or the like, among which a perfluorophenyl group, a perfluorobiphenyl group and a perfluoronaphthyl group are particularly preferable.

Moreover, each of the above-mentioned $Ar^1$, $Ar^2$, $Ar^3$ and $Ar^4$, may be substituted at an arbitrary position by an aryl group consisting of carbon and fluorine. As the aryl group consisting of carbon and fluorine to be used as a substituent, the same groups as described as groups represented by $Ar^1$, $Ar^2$, $A^3$ and $Ar^4$, may be applied, and the preferable range thereof is the same as that of those groups.

<Compounds Represented by General Formula (II)>

Preferable examples of the above-mentioned specific compound used in the present invention include a compound represented by the following general formula (II):

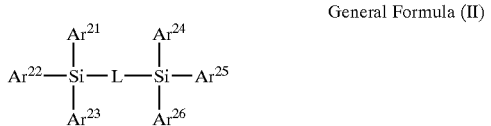

General Formula (II)

wherein in general formula (II), each of $Ar^{21}$, $Ar^{22}$, $Ar^{23}$, $Ar^{24}$, $Ar^{25}$ and $Ar^{26}$ represents an aryl group consisting of carbon and fluorine, and L represents a divalent arylene group consisting of carbon and fluorine.

Compounds represented by general formula (II) will be described in detail below.

The above-mentioned aryl group consisting of carbon and fluorine, represented by $Ar^{21}$, $Ar^{22}$, $A^{23}$, $Ar^{24}$, $Ar^{25}$ and $Ar^{26}$, are defined in the same manner as the aryl groups represented by $Ar^1$, $Ar^2$, $Ar^3$, and $Ar^4$ in general formula (I), and have the same preferable range.

L represents a divalent arylene group consisting of carbon and fluorine, and specific examples thereof include the following groups:

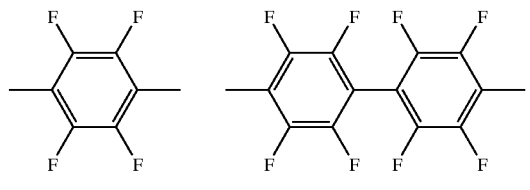

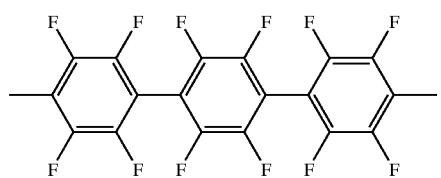

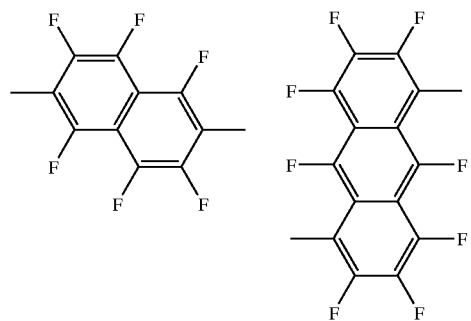

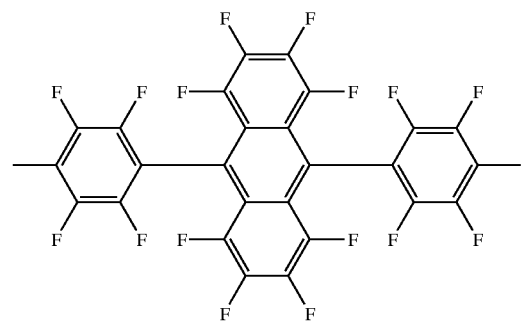

Specific examples of the specific compound of the invention (exemplified compounds (I-1) to (I-16) and (II-1) to (II-9)) are shown below. However, the present invention is not intended to be limited to these examples.

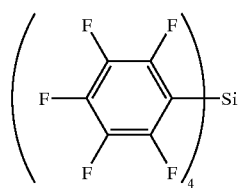
(I-1)
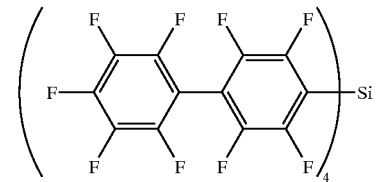
(I-2)
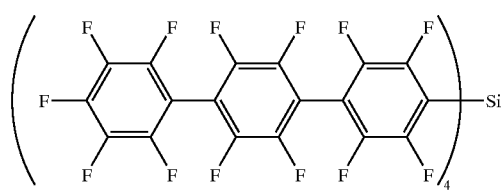
(I-3)
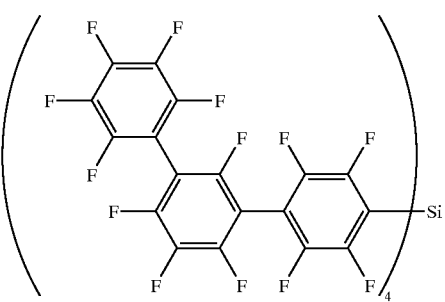
(I-4)
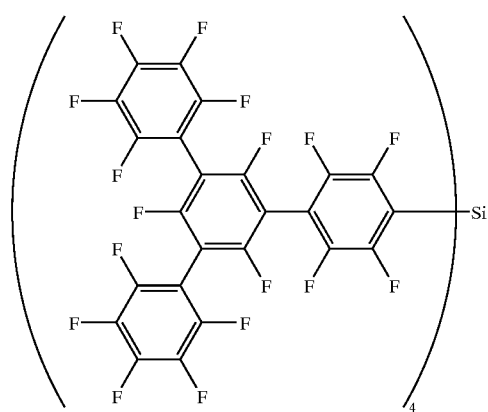
(I-5)
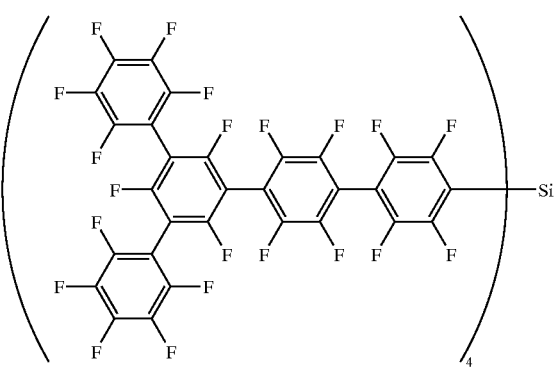
(I-6)
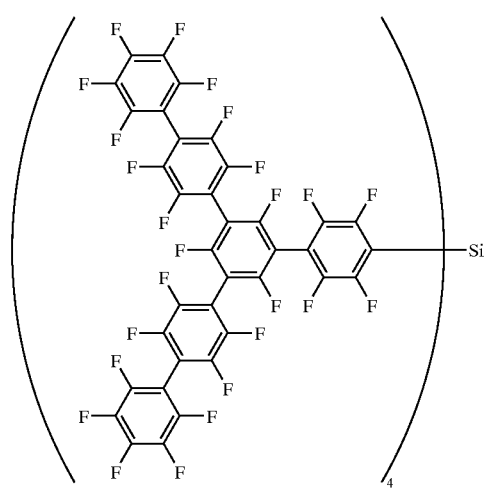
(I-7)
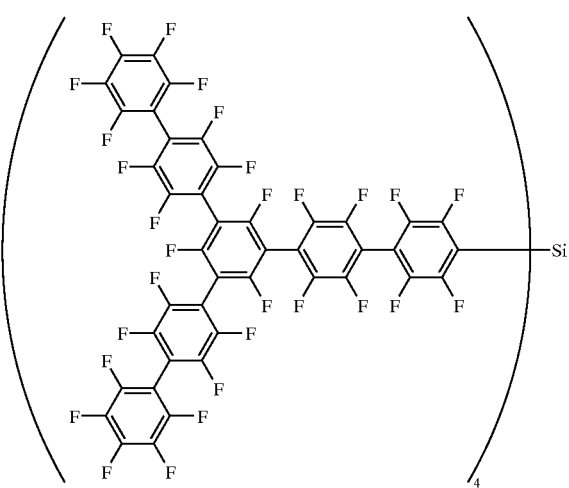
(I-8)

-continued
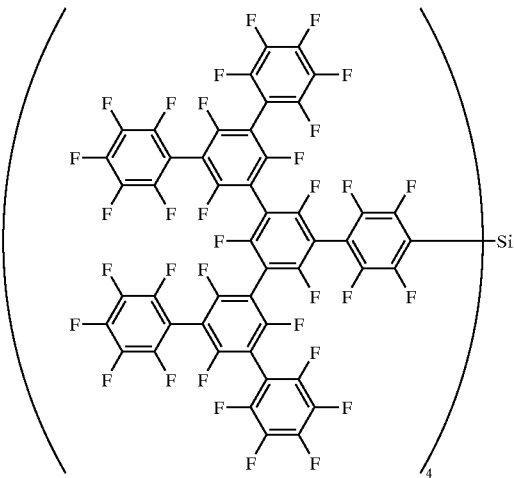
(I-9)
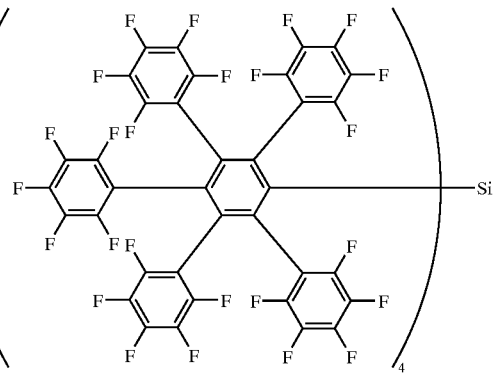
(I-10)
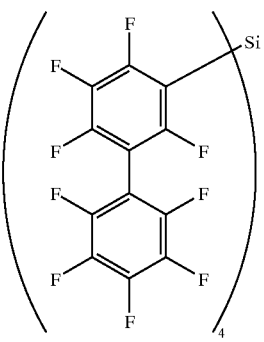
(I-11)
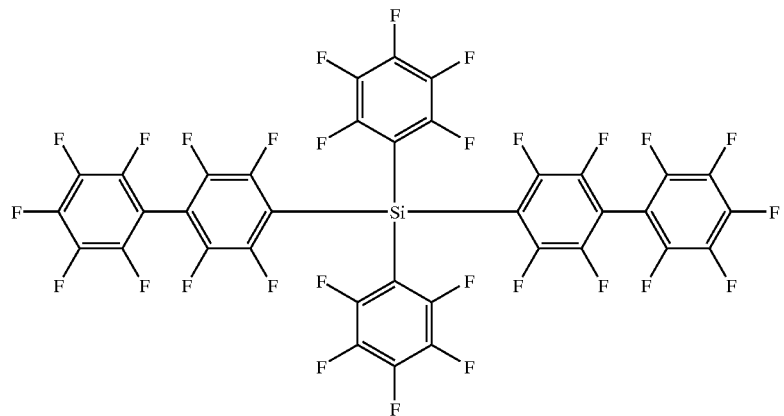
(I-12)
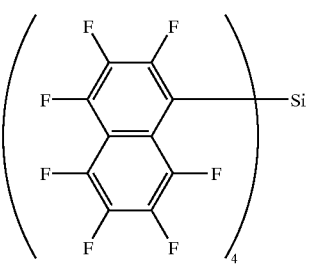
(I-13)
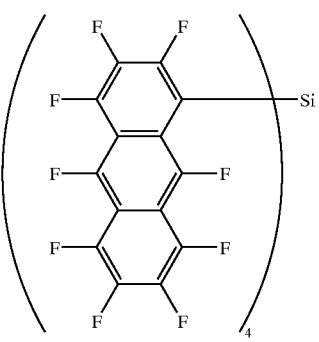
(I-14)

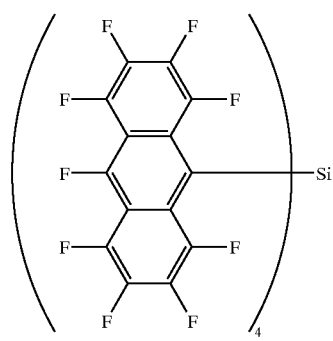
(I-15)
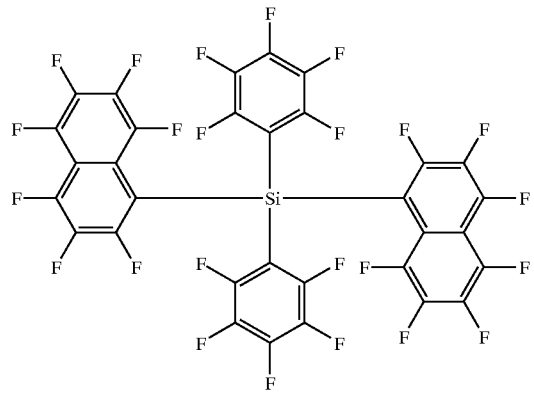
(I-16)
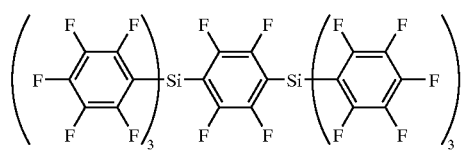
(II-1)
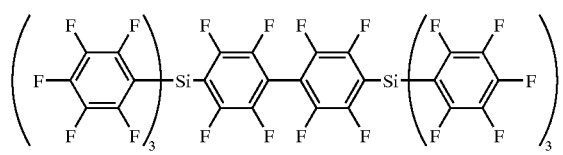
(II-2)
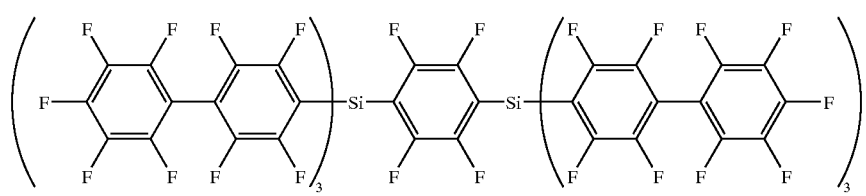
(II-3)
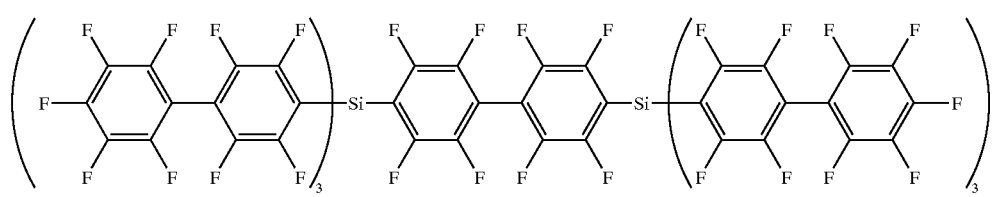
(II-4)
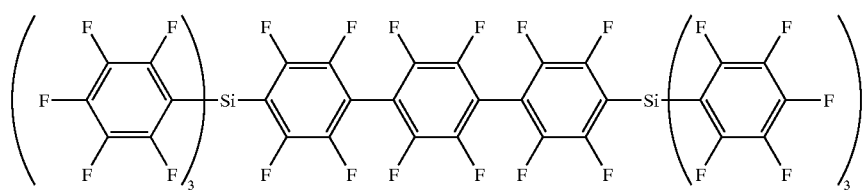
(II-5)
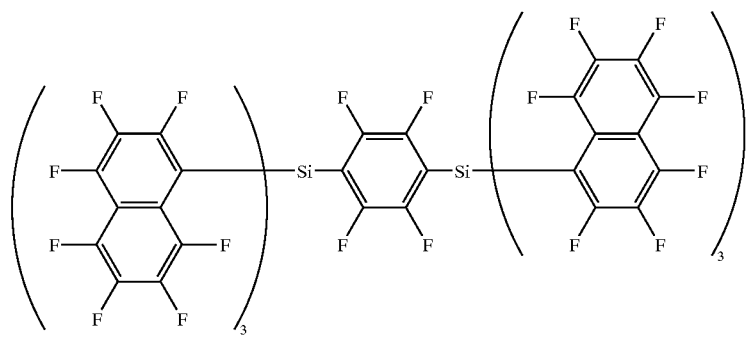
(II-6)

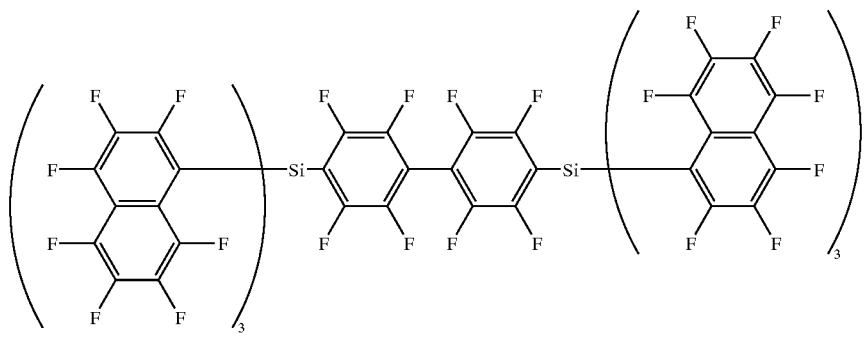

(II-7)

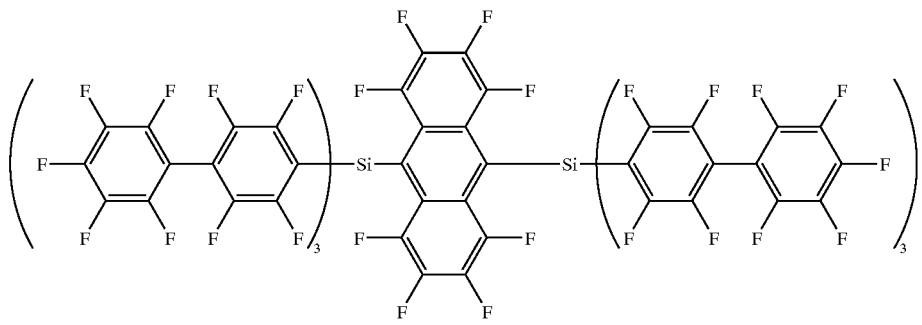

(II-8)

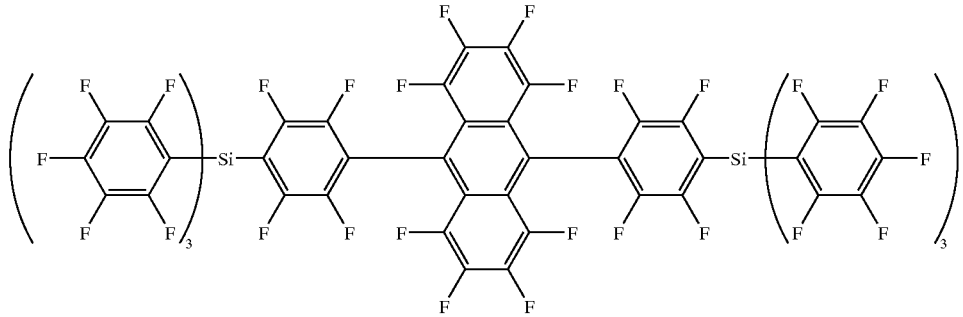

(II-9)

The specific compound may be synthesized by various known synthesizing methods. For example, it may be synthesized by allowing a mono-metalated perfluoroaryl derivative (for example, pentafluorophenyl lithium) to react with tetrachlorosilane.

The light emitting element of the present invention may utilize either light emission from an excited singlet state or light emission from an excited triplet state. With respect to the light emitting element of the invention, it is preferable to use light emission from an excited triplet state. Here, in the present specification, light emission from an excitation singlet state is defined as fluorescent light, and light emission from the excitation triplet state is defined as phosphorescent light.

Although not particularly limited, when the light emitting element of the invention utilizes light emission from the excited triplet state, examples of the material emitting phosphorescence (hereinafter, referred to as "phosphorescence emitting material") preferably include transition metal complexes, more preferably include complexes such as an iridium complex, a platinum complex, a rhenium complex and a ruthenium complex, and still more preferably include complexes such as an iridium complex and a platinum complex. An iridium complex is particularly preferable. Moreover, among the above-mentioned transition metal complexes, an orthometalated complexes are particularly preferable. The orthometalated complex referred to herein is a generic designation of the group of compounds described in Akio Yamamoto, Yûki Kinzoku Kagaku, Kiso to Ôyô ("Organic Metal Chemistry, Fundamentals and Applications", Shôkabô, 1982), pp. 150 and 232, and in H. Yersin, Photochemistry and Photophysics of Coordination Compounds (New York: Springer-Verlag, 1987), pp. 71–77 and pp. 135–146.

A phosphorescence quantum yield of the above-mentioned phosphorescence emitting material at 20° C. is preferably not less than 70%, more preferably not less than 80%, and still more preferably not less than 85%. In this case, the maximum value of the phosphorescence quantum yield is 100%, and the phosphorescence quantum yield is most preferably 100%. Moreover, a phosphor maximum wavelength is preferably from 300 nm to 500 nm, more preferably from 305 nm to 495 nm, further preferably from 310 nm to 490 nm, most preferably from 315 nm to 480 nm.

With respect to a light emitting element system of the light emitting element of the invention, an organic EL element is preferably used. In the organic EL element, the above-mentioned specific compound is preferably used as an electron transporting material (including a hole obstructing material) or as a host material to be used in a layer containing the light emitting material, and is most preferably used as the electron transporting material.

Constituent elements of the light emitting element of the invention will be described in more detail.

As described above, the light emitting element of the invention has at least one organic layer which is include a light emitting layer, and which is disposed between a pair of electrodes (anode and cathode), and at least one layer of the at least one organic layer contains the above-mentioned specific compound.

In a case where the specific compound is used as the electron transporting material, a mass ratio of the compound in the at least one organic layer containing the compound is preferably from 60 to 100% by mass, and more preferably from 70 to 100% by mass. In case of the specific compound is used as the host material, the mass ratio of the compound in the at least one organic layer containing the compound is preferably from 50 to 99.9% by mass, and more preferably from 60 to 99% by mass.

A method for forming the at least one organic layer in the light emitting element of the invention is not particularly limited, and various methods, such as a resistance heating vapor deposition method, an electrophotographic method, an electron beam method, a sputtering method, a molecular accumulation method, a coating method (such as a spray coating method, a dip coating method, an impregnation method, a roll coating method, a gravure coating method, a reverse coating method, a roll brush method, an air-knife coating method, a curtain coating method, a spin coating method, a flow coating method, a bar coating method, a micro gravure coating method, an air doctor coating method, a blade coating method, a squeeze coating method, a transfer roll coating method, a kiss coating method, a cast coating method, an extrusion coating method, a wire bar coating method and a screen coating method), an ink-jet method, a printing method and a transfer method are preferred. Among these, from the standpoint of characteristics of the element, ease of production and cost performance, the resistance heating vapor deposition method, the coating method and the transfer method are preferably used.

When the light emitting element has a multilayer structure comprising two or more layers, it is possible to manufacture the layers by combining the above-mentioned methods.

When a coating method is used as the forming method of the at least one organic layer, upon preparing a coating solution, materials and resin components to be contained in the respective layers may be commonly dissolved or dispersed therein. Examples of the resin components to be used at this time include: poly(vinyl chloride), polycarbonate, polystyrene, polymethylmethacrylate, polyester, polysulfone, polyphenylene oxide, polybutadiene, poly(N-vinyl carbazole), hydrogen carbide resin, ketone resin, phenoxy resin, polyamide, ethyl cellulose, vinyl acetate, ABS resin, polyurethane, melamine resin, unsaturated polyester resin, alkyd resin, epoxy resin and silicon resin.

Additionally, the light emitting element of the invention can exert superior light emitting characteristics even when the light emitting layer is formed by using a coating method which normally fails to provide high luminous efficiency.

The at least one organic layer in the light emitting element of the invention contains at least one light emitting layer, and in addition thereto, may contain a hole injecting layer, a hole transporting layer, an electron injecting layer, an electron transporting layer, a protective layer or the like. Moreover, these layers may respectively have other functions. The specific compound may be contained in any of these layers. The respective layers will be described in detail below.

A material for the hole injecting layer and the hole transporting layer may be a material having one of a function of injecting holes from the anode, a function of transporting the holes, and a function of obstructing electrons injected from the cathode. Specific examples thereof include a a carbazole, a triazole, an oxazole, an oxadiazole, an imidazole, a polyarylalkane, a pyrazoline, a pyrazolone, a phenylenediamine, an arylamine, an amino-substituted chalcone, a styrylanthracene, a fluorenone, a hydrazone, a stilbene, a silazane, an aromatic tertiary amine compound, a styiylamine compound, an aromatic dimethylidyne series compound, a porphyrin series compound, a polysilane series compound, a poly(N-vinylcarbazole), an aniline series copolymer, and an oligomer of an electroconductive polymer, such as a thiophene oligomer and polythiophene, or derivatives of these compounds.

Film thickness of the hole injecting layer and the hole transporting layer are not particularly limited, and in general, are preferably from 1 nm to 5 $\mu$m, more preferably from 5 nm to 1 $\mu$m, and still more preferably from 10 nm to 500 nm.

The hole transporting layer may have a single layer structure of one or more kinds of the above-mentioned materials or, alternatively, a multilayer structure comprising plural layers having the same composition or different compositions.

A material for the electron injecting layer and the electron transporting layer may be a material having one of a function of injecting electrons from the cathode, a function of transporting the electrons, and a function of obstructing holes injected from the anode. Specific examples thereof include a triazole, a triazine, an oxazole, an oxadiazole, a fluorenone, an anthraquinodimethane, an anthrone, a diphenylquinone, a thiopyrane dioxide, a carbodiimide, a fluorenilidenemethane, a distyrylpyrazine, a silole, an aromatic ring tetra-carboxylic acid anhydride such as naphthaleneperylene, a phthalocyanine, various kinds of metallic complexes, such as a metallic complex of a 8-quinolinol derivative and a metallic complex having metal phthalocyanine, benzoxazole, or benzothiazole as a ligand, and derivatives of the above-mentioned compounds.

Film thickness of the electron injecting layer and the electron transporting layer are not particularly limited, and in general, are preferably from 1 nm to 5 $\mu$m, more preferably from 5 nm to 1 $\mu$m, still more preferably from 10 nm to 500 nm.

The electron injecting layer and the electron transporting layer may each have a single layer structure of one or more kinds of the above-mentioned materials or, alternatively, a multilayer structure comprising plural layers having the same composition or different compositions.

A material for the light-emitting layer is not particularly limited as long as it is capable of forming a layer in which it is possible for holes to be injected thereto from the anode, the hole injecting layer or the hole transporting layer upon application of an electric field, and in which it is possible for electrons to be injected thereto from the cathode, an electron injecting layer or the electron transporting layer. The material for the light emitting layer must also function to transfer the injected charge and to provide a place for the recombination of holes and electrons to emit light.

Examples of a compound to be used in the light emitting layer include: a benzoxazole, a benzimidazole, a benzothiazole, a styryl benzene, a polyphenyl, a diphenylbutadiene, a tetraphenyl butadiene, a naphthalimide, a coumaline, a perylene, a perynone, an oxadiazole, an ardazine, a pyralizine, a cyclopentadiene, a bisstyrylanthracene, a quinacridone, a pyrolopyridine, a thiadiazolopyridine, a styrylamine, aromatic dimethylidine compounds, metal complexes of 8-quinolinol derivatives, metal complexes of phenylpyridine derivatives, various types of metal complexes represented by organic metal complexes and rare earth metal complexes, polymer compounds such as polythiofene, polyphenylene and polyphenylenevinylene, and derivatives of the above-mentioned compounds.

Here, at least one kind of the materials contained in the light emitting layer is preferably provided as the above-mentioned phosphorescence emitting material.

A film thickness of the light emitting layer is not particularly limited, and is preferably from 1 nm to 5 µm, more preferably from 5 nm to 1 µm, and still more preferably from 10 nm to 500 nm.

A material for the protective layer may be those having a function of suppressing entrance of substances that accelerate deterioration of the element, such as moisture and oxygen, into the element.

Specific examples thereof include metals, such as In, Sn, Pb, Au, Cu, Ag, Al, Ti and Ni, metallic oxides, such as MgO, SiO, $SiO_2$, $Al_2O_3$, GeO, NiO, CaO, BaO, $Fe_2O_3$, $Y_2O_3$ and $TiO_2$, metallic fluorides, such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture containing tetrafluoroethylene and at least one kind of comonomer, a fluorine-containing copolymer having a cyclic structure in a copolymer main chain, a water absorbing substance having a water absorption rate of 1% or more, and a moisture preventing substance having a water absorption rate of 0.1% or less.

A method of forming the protective layer is also not particularly limited, and examples of applicable forming methods thereof include a vacuum deposition method, a sputtering method, a reactive sputtering method, a molecular beam epitaxy (MBE) method, a cluster ion beam method, an ion plating method, a plasma copolymerization method (high-frequency excitation ion plating process), a plasma CVD method, a laser CVD method, a heat CVD method, a gas source CVD method, a coating method, an ink jet method, a printing method, a tranfer method, and an electrophotographic method.

The materials of the anode may comprise a metal, an alloy, a metallic oxide, an electroconductive compound, or mixture thereof, Examples of a material for the anode include metals, alloys, metallic oxides, electroconductive compounds and mixtures thereof, and a material having a work function of 4 eV or more is preferable. Specific examples thereof include electroconductive metallic oxides, such as tin oxide, zinc oxide, indium oxide and indium tin oxide (ITO), metals, such as gold, silver, chromium and nickel, mixtures or laminates of these metals and electroconductive metallic oxides, inorganic electroconductive substances, such as copper iodide and copper sulfide, organic electroconductive materials, such as polyaniline, polythiophen and polypyrrole, and mixtures or laminates of these materials and ITO. Among these, electroconductive metallic oxide are preferable, and ITO is particularly preferable from the standpoint of productivity, high electroconductivity and transparency.

A film thickness of the anode can be appropriately selected depending on the material, and in general, is preferably from 10 nm to 5 µm, more preferably from 50 nm to 1 µm, and still more preferably from 100 nm to 500 nm.

The anode is generally formed as a layer on a transparent substrate, such as soda lime glass, non-alkali glass or a transparent resin substrate. When glass is used as the transparent substrate, the glass material is preferably non-alkali glass in order to reduce eluted ions from the glass. When soda lime glass is used, it is preferable to use a soda lime glass having a barrier coating of, for example, silica. A thickness of the substrate is not particularly limited as long as it sufficiently maintains mechanical strength, and is generally 0.2 mm or more, and preferably 0.7 mm or more when glass is used.

The anode can be produced by various methods depending on the material, and in the case of ITO, for example a film thereof may be produced by an electron beam method, a sputtering method, a resistance heating vapor deposition method, a chemical reaction method (a sol-gel method), a spraying method, a dip coating method, a thermal CVD process, a plasma CVD process, coating method in which a dispersion of indium tin oxide is applied, or the like.

If the anode is subjected to various treatment, such as cleaning, a driving voltage of the light emitting element can be decreased, and light emission efficiency thereof can be improved. In the case of ITO, for example, a UV-ozone treatment, a plasma treatment, and the like are effective.

The cathode is for supplying electrons to the electron injecting layer, the electron transporting layer, the light emitting layer or the like, and is selected in consideration of adhesion to a layer adjacent to the cathode, such as the electron injecting layer, the electron transporting layer or the light emitting layer, ionization potential and stability.

Examples of a material for the cathode include metals, alloys, metallic oxides, electroconductive compounds and mixtures thereof. Specific examples thereof include alkali metals (such as Li, Na and K) and fluorides thereof, alkaline earth metals (such as Mg and Ca) and fluorides thereof, gold, silver, lead, aluminum, alloys or metallic mixtures of sodium and potassium, alloys or metallic mixtures of lithium and aluminum, alloys or metallic mixtures of magnesium and silver, and rare earth metals, such as indium and ytterbium. Among these, a material having a work function of 4 eV or less is preferable, and aluminum, an alloy or a metallic mixture of lithium and aluminum, and an alloy or a metallic mixture of magnesium and silver are more preferable.

A film thickness of the cathode can be appropriately selected depending on the material, and in general, is preferably from 10 nm to 5 µm, more preferably from 50 nm to 1 µm, and still more further preferably from 100 nm to 1 µm.

The cathode can be produced by various methods, such as an electron beam method, a sputtering method, a resistance heating vapor deposition method and a coating method, and a metal may be vapor-deposited as a single substance or, alternatively, two or more components may be simultaneously vapor-deposited. Furthermore, plural metals may be simultaneously vapor-deposited to form an alloy electrode, or an alloy prepared in advance may be vapor-deposited.

A sheet resistance of the anode and the cathode is preferably as low as possible, and is preferably several hundred Ω per square or less.

The light-emitting element of the present invention can be applied to technologies in various fields, such as display devices, displays, backlights, electrophotography, illumination light sources, recording light sources, exposure light sources, reading light sources, signs, signboards, interior lighting, optical communication and the like.

EXAMPLES

The present invention will be described in more detail below by means of examples. However, the invention is not intended to be limited by these examples.

Synthesis Example 1

Synthesis of Exemplified Compound (I-1)

5.0 g of pentafluorobenzene (manufactured by Tokyo Kasei Kogyo Co., Ltd.) was dissolved in 120 mL of tetrahydrofran, and this solution was cooled to −70° C. 18.6 mL of n-butyl lithium/n-hexane solution (1.6 M)(manufactured by Wako Pure Chemical Industries, Ltd.) was slowly dripped thereto for 30 minutes. After completion of the dripping process, the resulting solution was stirred at −70° C. for 30 minutes. 50 mL of tetrahydrofran solution containing 1.26 g of tetrachlorosilane (manufactured by Tokyo Kasei Kogyo Co., Ltd.) was dripped thereto at −70° C., and the resulting solution was heated to room temperature, and stirred for 1 hour at room temperature. The reaction product was put into water, and a deposited white solid matter was filtered out, and sufficiently washed with water and methanol. After being dried, the structure of the example compound (I-1) was confirmed by using a mass-spectrum.

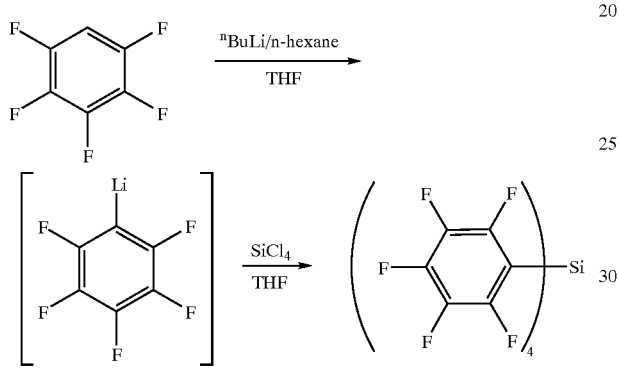

Example 1

Preparation of Organic EL Element

A glass substrate having dimensions of 25 mm×25 mm×0.7 mm, on which ITO was coated at a thickness of 150 nm (manufactured by Sanyo Vacuum Industries Co., Ltd.), was used as a transparent supporting substrate. After etching and washing the glass substrate, TPD (N,N'-diphenyl-N,N'-di(m-tolyl)-benzidine) was vapor-deposited thereon to a thickness of 50 nm, the following compounds a and b were vapor-deposited thereon at a mass ratio of 34:2 to a thickness of 36 nm, and the exemplified compound (I-3) was further vapor-deposited thereon at a thickness of 36 nm.

After providing a patterned mask (providing a light emission area of 4 mm×5 mm) on the organic thin film, lithium fluoride was vapor-deposited to a thickness of 3 nm, and then aluminum was vapor-deposited to a thickness of 60 nm, whereby an organic EL element of example 1 was produced.

Evaluation

Evaluation Method

The resulting organic EL element was subjected to light emission by applying a constant direct current voltage by using a source measuring unit 'Type 2400 produced by Toyo Corp.' and the luminance was measured by using a luminance meter 'BM-8 produced by Topcon Corp'.

The light emission wavelength and the CIE chromaticity coordinate were measured by using spectrum analyzer 'PMA-11 produced by Hamamatsu Photonics Co., Ltd.'.

Evaluation Results

As a result, light emission with CIE chromaticity coordinates of (x, y)=(0.19, 0.49) was obtained, and the external quantum efficiency thereof was 8.4% (light emission from an excited triplet state).

The same evaluation was carried out after the resulting element had been left at room temperature for a week, and the external quantum efficiency thereof was 8.2%.

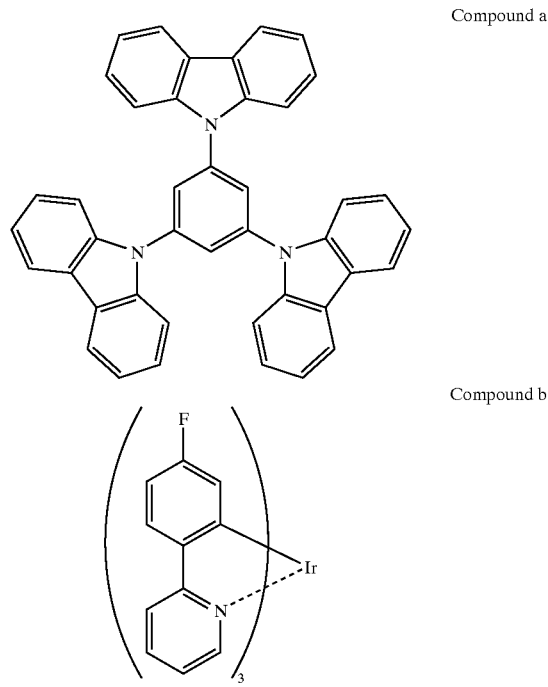

Comparative Example 1

An organic EL element of comparative example 1 was produced in the same manner as in example 1 except that a compound C shown below was used instead of the exemplified compound (I-3).

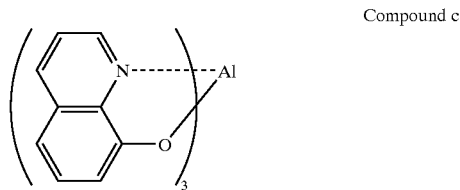

The resulting organic EL element was evaluated in the same manner as in example 1. As a result, light emission with CIE chromaticity coordinates of (x, y)=(0.24, 0.55) was obtained, and the external quantum efficiency thereof was 1.7%.

The same evaluation was carried out after the resulting element had been left at room temperature for a week, and the external quantum efficiency thereof was 0.4%.

Example 2

α-NPD (N,N'-diphenyl-N,N'-di(α-naphthyl)-benzidine) was vapor-deposited to a thickness of 40 nm on a ITO substrate washed in the same manner as in example 1, a compound d shown below (blue light emitting material) was vapor-deposited to a thickness of 20 nm, and the exemplified compound (I-1) was vapor-deposited thereon to a thickness of 40 nm.

After providing a patterned mask (providing a light emission area of 4 mm×5 mm) on the obtained organic thin film, magnesium and silver (10/1) were simultaneously vapor-deposited to a thickness of 50 nm, and then silver was vapor-deposited to a thickness of 50 nm, whereby an organic EL element of example 2 was produced.

Compound d

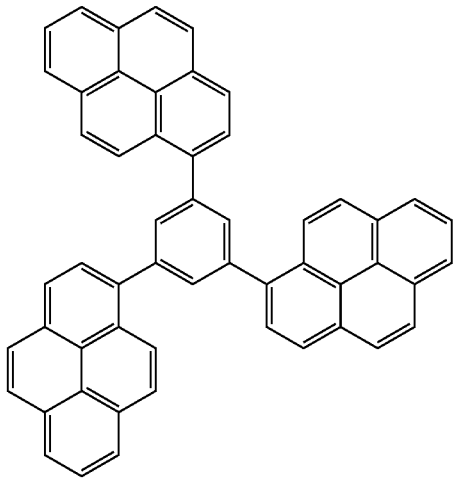

The resulting organic EL element was evaluated in the same manner as in example 1. As a result, light emission with CIE chromaticity coordinates of (x, y)=(0.15, 0.27) was obtained, and the external quantum efficiency thereof was 3.4% (light emission from an excitation singlet state).

The same evaluation was carried out after the resulting element had been left at room temperature for a week, and the external quantum efficiency thereof was 3.0%.

Comparative Example 2

An organic EL element of comparative example 2 was produced in the same manner as in example 2 except that the above-mentioned compound C was used instead of the exemplified compound (I-1).

The resulting organic EL element was evaluated in the same manner as in example 1. As a result, light emission with CIE chromaticity coordinates of (x, y)=(0.25, 0.47) was obtained, and the external quantum efficiency thereof was 1.8%.

The same evaluation was carried out after the resulting element had been left at room temperature for a week, and the external quantum efficiency thereof was 1.0%.

Example 3

Baytron P (manufactured by Bayer Corp.) was coated on ITO substrate washed in the same manner as in example 1 by a spin coating method, and then the substrate was vacuum-dried at 150° C. for 1.5 hours, whereby a thin film having a film thickness of 70 nm was obtained. Then a solution prepared by dissolving 40 mg of poly(N-vinyl carbazole) and 1 mg of the above-mentioned compound b in 2.5 mL of dichloroethane was coated thereon by a spin coating method to form a film having a film thickness of 100 nm.

The exemplified compound (I-1) was vapor deposited thereon to a thickness of 40 nm. After providing a patterned mask (providing a light emission area of 4 mm×5 mm) on the organic thin film, lithium fluoride was vapor-deposited to a thickness of 3 nm, and then aluminum was vapor-deposited to a thickness of 60 nm, whereby an organic EL element of example 3 was produced.

The resulting organic EL element was evaluated in the same manner as in example 1. As a result, light emission with CIE chromaticity coordinates of (x, y)=(0.19, 0.51) was obtained, and the external quantum efficiency thereof was 2.1% (light emission from an excited triplet state).

The same evaluation was carried out after the resulting element had been left at room temperature for a week, and the external quantum efficiency thereof was 1.6%.

Comparative Example 3

An organic EL element of comparative example 3 was produced in the same manner as in example 3 except that the above-mentioned compound C was used instead of the exemplified compound (I-1).

The resulting organic EL element was evaluated in the same manner as in example 1. As a result, light emission with CIE chromaticity coordinates of (x, y)=(0.25, 0.53) was obtained, and the external quantum efficiency thereof was 0.2%.

The same evaluation was carried out after the resulting element had been left at room temperature for a week. However, no light emission was obtained.

The results of examples 1 to 3 and comparative examples 1 to 3 show that the light emitting element of the present invention is superior in light emitting characteristics (high luminance, and high luminous efficiency), and has superior endurance.

In other words, in both of cases when light emission from an excited triplet state is utilized and cases when light emission from an excited singlet state is utilized, as well as even when a coating method that normally causes low luminous efficiency is used in preparing the light emitting element, the light emitting element makes it possible to provide high external quantum efficiency with superior light emitting characteristics and also to provide high endurance. The light emitting element also improves the color purity (in particular, purity of blue) in light emission colors.

As described above, in accordance with the light emitting element of the present invention, it becomes possible to provide a light emitting element that has high luminance, high luminous efficiency and superior endurance. Further, it becomes possible to provide a light emitting element that has high color purity (in particular, purity of blue).

What is claimed is:

1. A light emitting element comprising at least one organic layer which includes a light emitting layer, and which is disposed between a pair of electrodes, wherein at least one layer of the at least one organic layer contains at least one compound consisting essentially of carbon, fluorine and silicon.

2. The light emitting element of claim 1, wherein said at least one compound consisting essentially of carbon, fluorine and silicon contains hydrogen atoms in an amount of not greater than two hydrogen atoms per six carbon atoms.

3. The light emitting element of claim 1, wherein said at least one compound consisting essentially of carbon, fluorine and silicon is represented by the following general formula (I):

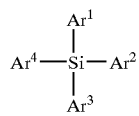

General Formula (I)

wherein in general formula (I), each of $Ar^1$, $Ar^2$, $Ar^3$ and $Ar^4$ represents an aryl group consisting of carbon and fluorine.

4. The light emitting element of claim 3, wherein each of $Ar^1$, $Ar^2$, $Ar^3$ and $Ar^4$ in general formula (I) is selected from the group consisting of a perfluorophenyl group, a perfluorobiphenyl group, a perfluoronaphthyl group, a perfluoroanthracenyl group, a perfluorophenanthryl group, a perfluoropyrenyl group, a perfluoronaphthacenyl group and a perfluoroperylenyl group.

5. The light emitting element of claim 1, wherein said at least one compound consisting essentially of carbon, fluorine and silicon is represented by the following general formula (H):

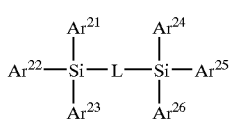

General Formula (II)

wherein in general formula (II), $Ar^{21}$, $Ar^{22}$, $Ar^{23}$, $Ar^{24}$, $Ar^{25}$ and $Ar^{26}$ each independently represent an aryl group consisting of carbon and fluorine; and L represents a divalent arylene group consisting of carbon and fluorine.

6. The light emitting element of claim 5, wherein each of $Ar^{21}$, $Ar^{22}$, $Ar^{23}$, $Ar^{24}$ $Ar^{25}$ and $Ar^{26}$ in the general formula (II) is selected from the group consisting of a perfluorophenyl group, a perfluorobiphenyl group, a perfluoronaphthyl group, a perfluoroanthracenyl group, a perfluorophenanthryl group, a perfluoropyrenyl group, a pefluoronaphthacenyl group and a perfluoroperylenyl group.

7. The light emitting element of claim 1, wherein said at least one compound consisting essentially of carbon, fluorine and silicon has a glass transition temperature in a range of 130° C. to 400° C.

8. The light emitting element of claim 1, wherein light emission from an excited triplet state is utilized.

9. The light emitting element of claim 8, wherein said at least one compound consisting of carbon, fluorine and silicon has a minimum excited triplet energy level of 65 kcal/mol (272.35 kJ/mol) to 95 kcal/mol (398.05 kJ/mol) when light emission from an excited triplet state is utilized.

10. The light emitting element of claim 1, wherein said at least one compound consisting essentially of carbon, fluorine and silicon is used as an electron transporting material.

11. The light emitting element of claim 10, wherein said at least one compound consisting essentially of carbon, fluorine and silicon, which is used as an electron transporting material, is contained in a amount of 60 to 100% by mass in an organic layer containing the electron transporting material.

12. The light emitting element of claim 1, wherein said at least one compound consisting essentially of carbon, fluorine and silicon is used as a host material in a layer containing a light emitting material.

13. The light emitting element of claim 12, wherein the compound, which is used as a host material, is contained in an amount of 50 to 99.9% by mass in an organic layer containing the host material.

14. The light emitting element of claim 1, wherein the at least one organic layer contains a phosphorescent material.

15. The light emitting element of claim 14, wherein the phosphorescent material is a transition metal complex.

16. The light emitting element of claim 15, wherein the transition metal complex is selected from the group consisting of an iridium complex, a platinum complex, a rhenium complex and a ruthenium complex.

17. The light emitting element of claim 16, wherein the transition metal complex is an iridium complex.

18. The light emitting element of claim 1, wherein the at least one organic layer is formed by a resistance heating vapor deposition method, a coating method or a transferring method.

19. The light emitting element of claim 1, wherein the light emitting layer is formed by a coating method.

20. A light emitting element comprising a pair of electrodes and at least one organic layer which includes a light emitting layer, and which is disposed between said pair of electrodes, wherein at least one layer of the at least one organic layer contains at least one compound consisting of carbon, fluorine and silicon.

21. The light emitting element of claim 20, wherein the at least one compound consisting of carbon, fluorine and silicon has a glass transition temperature in a range of 130° C. to 400° C.

22. The light emitting element of claim 20, wherein the at least one compound consisting of carbon, fluorine and silicon has a minimum excited triplet energy level of 65 kcal/mol (272.35 kJ/mol) to 95 kcal/mol (398.05 kJ/mol) when light emission from an excited triplet state is utilized.

23. The light emitting element of claim 20, wherein the at least one compound consisting of carbon, fluorine and silicon is used as an electron transporting material.

24. The light emitting element of claim 20, wherein the at least one compound consisting of carbon, fluorine and silicon is used as a host material in a layer containing a light emitting material.

25. The light emitting element of claim 20, wherein the at least one organic layer further contains a phosphorescent material.

26. The light emitting element of claim 25, wherein the phosphorescent material is a transition metal complex.

* * * * *